(12) United States Patent
Wong et al.

(10) Patent No.: US 8,103,469 B1
(45) Date of Patent: Jan. 24, 2012

(54) TRANSCEIVER LINK BIT ERROR RATE PREDICTION

(75) Inventors: San Wong, Cupertino, CA (US); Daniel Tun Lai Chow, Foster City, CA (US); Geping Liu, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 1397 days.

(21) Appl. No.: 11/297,611

(22) Filed: Dec. 7, 2005

(51) Int. Cl.
*G01R 13/00* (2006.01)
*G01R 13/02* (2006.01)
*G01R 29/26* (2006.01)

(52) U.S. Cl. ............... 702/66; 702/67; 702/69

(58) Field of Classification Search ............. 702/66, 702/67, 69
See application file for complete search history.

(56) References Cited

U.S. PATENT DOCUMENTS

| | | | | |
|---|---|---|---|---|
| 5,001,422 A | * | 3/1991 | Dahlberg et al. | 324/763 |
| 5,051,938 A | * | 9/1991 | Hyduke | 703/15 |
| 5,828,983 A | * | 10/1998 | Lombardi | 702/66 |
| 6,018,246 A | * | 1/2000 | Dunsmore et al. | 324/638 |
| 6,356,850 B1 | * | 3/2002 | Wilstrup et al. | 702/69 |
| 6,691,291 B2 | * | 2/2004 | Gauthier et al. | 716/113 |
| 6,701,269 B1 | * | 3/2004 | Jungerman et al. | 702/106 |
| 6,760,673 B2 | * | 7/2004 | Genther et al. | 702/75 |
| 7,062,393 B2 | * | 6/2006 | Laquai | 702/69 |
| 2002/0186760 A1 | * | 12/2002 | Bostoen et al. | 375/224 |
| 2003/0073328 A1 | * | 4/2003 | Driscoll et al. | 439/65 |
| 2003/0227936 A1 | * | 12/2003 | Lynch et al. | 370/449 |
| 2005/0046456 A1 | * | 3/2005 | d'Haene et al. | 327/165 |
| 2005/0075810 A1 | * | 4/2005 | Laquai | 702/69 |
| 2005/0267696 A1 | * | 12/2005 | Yamaguchi et al. | 702/57 |
| 2006/0018374 A1 | * | 1/2006 | Nelson et al. | 375/227 |

OTHER PUBLICATIONS

Kim, K.K., J. Huang, Y-B Kim, and F. Lombardi, On the Modeling and Analysis of Jitter in ATE Using Matlab (Oct. 2005) 20th IEEE International Symposium on Defect and Fault Tolerance in VLSI Systems,(DFT '05).*

Bockelman, D.E., and W. Eisenstadt, Combined Differential and Common-Mode Scattering Parameters: Theory and Simulation (Jul. 1995) IEEE Transactions on Microwave Theory and Techniques, vol. 45, No. 7, pp. 1530-1539.*

"Jitter Separation—50 Mb/s to Over 40 Gb/s Using the Agilent 86100C Infiniium DCA-J", [online] [retrieved Jul. 5, 2011] Retrieved from: www.eeplace.com/dm/2802/tx/DCAjwhitepaper3.pdf. Agilent Technologies, Inc., Printed in U.S.A. Dec. 9, 2003, 27 pages.

* cited by examiner

*Primary Examiner* — Andrew Schechter
*Assistant Examiner* — Janet Suglo
(74) *Attorney, Agent, or Firm* — Weaver Austin Villeneuve and Sampson LLP

(57) ABSTRACT

A method for predicting a predetermined bit error rate for an actual data transmission from a transmitter to a target receiver over an actual backplane link is disclosed. The method involves defining a simulated backplane corresponding to an actual backplane link intended to be used for data transmission between a transmitter and a target receiver. Once the simulated backplane is defined, a data transmission from the transmitter to the receiver is simulated and captured across the simulated backplane. A waveform simulation of the data transmission over the simulated backplane is then generated. The waveform simulation takes into account characteristics of the simulated backplane and the target receiver. From the waveform simulation, a total jitter for a predetermined bit error rate for the data transmission is extrapolated.

47 Claims, 8 Drawing Sheets

US 8,103,469 B1

TRANSCEIVER LINK BIT ERROR RATE PREDICTION

BACKGROUND

1. Field of the Invention

The present invention generally relates to data communications, and more particularly, to a method for predicting a total jitter estimation at a predetermined bit error rate for an actual data transmission from a transmitter to a target receiver over an actual backplane link using a software algorithm that (i) creates a mathematical model of the backplane; (ii) generates a waveform simulation of the data transmission across the mathematical model of the backplane; and then (iii) extrapolates the total jitter for the predetermined bit error rate for the data transmission from the waveform simulation.

2. Description of Related Art

In digital data communication systems, bits of information often need to be transmitted from a transmitting location to a receiving location. Typically the transmission occurs across a backplane coupled between the transmitter and the receiver. The transmitter places a sequence of bits through its output ports onto a backplane link. The bits travel across the backplane link to the input ports of the receiver. Current data communication systems are capable of transmitting one Giga-bytes or more of information per second. This figure will continue to grow significantly as semiconductor processing and digital communications systems improve in the future.

With many digital communication systems, the bit error rate or ratio, commonly referred to as "BER," is used as one specification for measuring the performance of the system. The bit error rate or ratio is the acceptable number of erroneous bits received divided by the total number of bits transmitted. The BER is usually expressed as a coefficient of the power of 10, for example 1 erroneous bit out of $10^{12}$ (one trillion). Stated another way, a system having a BER specification of $10^{-12}$ requires no more than one erroneous bit for each trillion bits transferred. If the measured number of erroneous bits in a data transmission is one or less, then the system is said to be operating within specification. If the number of erroneous bits is more than one per trillion, then the system is not operating within specification.

Currently the BER is determined in one of two ways. In the first instance, dedicated hardware is provided on the receiver. Logic, typically embedded on the semiconductor chip acting as the receiver, is used to perform the BER calculation. The other alternative is to use dedicated test equipment coupled to the receiver. This hardware is used to calculate the BER and calculate the results during an actual data transmission.

There are a number of problems associated with both solutions. Each require dedicated hardware and logic, either on the receiver chip or off chip, designed for a specific communication system. This hardware and logic is time consuming to design, expensive to make and inflexible. With each new communication system, new hardware and logic will often need to be developed. Lastly, with on-chip solutions, the circuitry used to implement the BER function takes away space on the silicon that could otherwise be used for performing other functions. The BER circuitry is thus overhead that tends to increase the size of the chip, which in turn, may reduce yields. The use of hardware implementations for calculating BER is therefore generally unsatisfactory and less than ideal.

A method is therefore needed for predicting a predetermined bit error rate for an actual data transmission from a transmitter to a target receiver over an actual backplane link using a software algorithm that: (i) creates a mathematical model of the backplane; (ii) generates a waveform simulation of the data transmission over the modeled backplane; and then (iii) extrapolates total jitter for the predetermined bit error rate for the data transmission from the waveform simulation.

SUMMARY OF THE INVENTION

A method for predicting a predetermined bit error rate for an actual data transmission from a transmitter to a target receiver over an actual backplane link is disclosed. The method involves defining a simulated backplane corresponding to an actual backplane link intended to be used for data transmission between a transmitter and a target receiver. Once the simulated backplane is defined, a data transmission from the transmitter to the receiver is simulated and captured across the simulated backplane. A waveform simulation of the data transmission over the simulated backplane is then generated. The waveform simulation takes into account characteristics of the simulated backplane and the target receiver. From the waveform simulation, a total jitter for a predetermined bit error rate for the data transmission is extrapolated.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as those using programmable devices, or application-specific integrated circuit (ASIC) devices, or a combination thereof.

Figure 1:
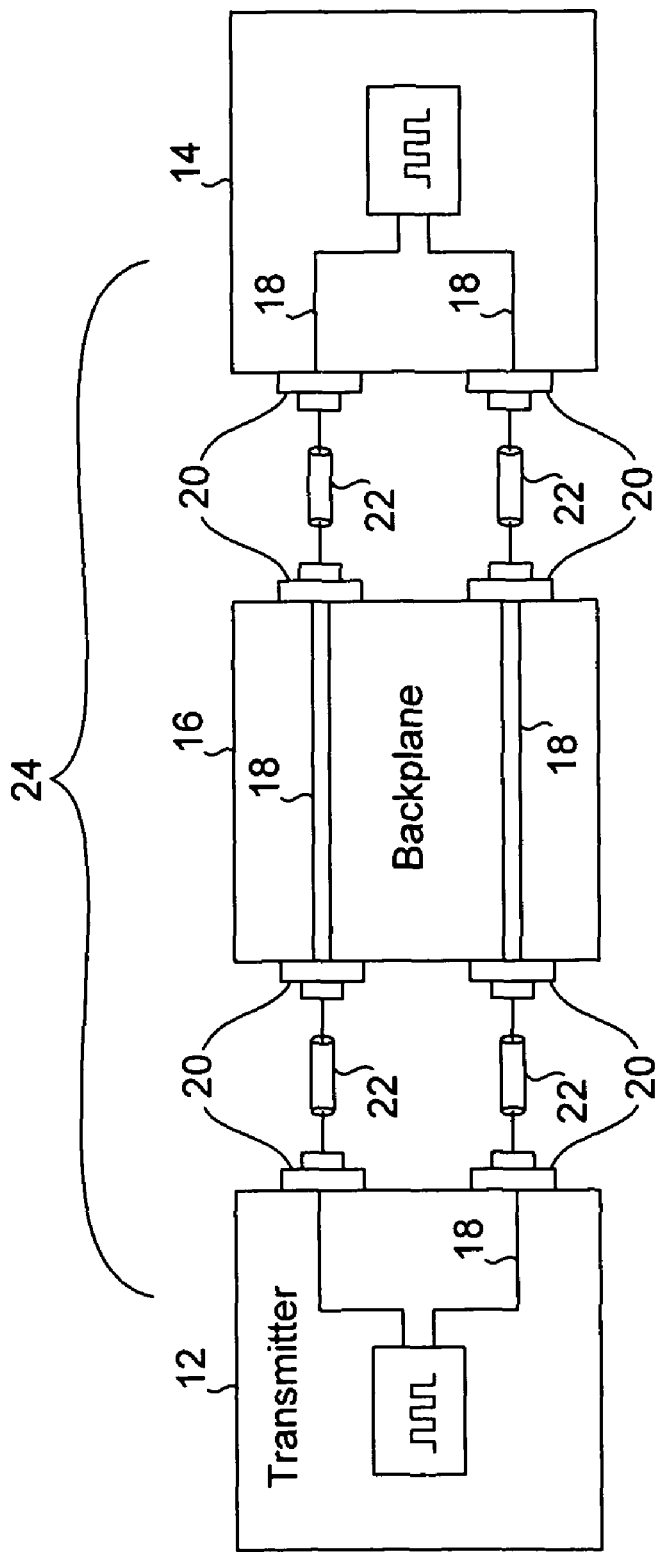
FIG. 1 is a block diagram of a communication system including a transmitter, receiver and backplane.

Referring to FIG. 1, a block diagram of a communication system is shown. The communication system 10 includes a transmitter 12, a receiver 14, and a backplane 16. Traces 18 on the transmitter, receiver, backplane and connectors 20 are provided to enable the transmission of data from the transmitter 12, across the backplane 16, to the receiver 14. In the embodiment shown, differential coax cables 22 are provided between the transmitter 12, receiver 14 and backplane 16. The entire link, including the connectors 20, cables 22, and the backplane 16, are referred to sometimes at the backplane link 24.

The transmission of data in most communication systems involves the transmission of a series of voltage values, each indicative of a bit defined by a fixed clock period. In other words with each clock period, the conveyed data bit is considered a logic high or "one" if the voltage of the signal is higher than a designated first threshold voltage and considered a logic low or "zero" if it is less than a second threshold voltage.

According to one embodiment, the backplane 16 is a printed circuit board with one or more traces used to convey the data from the transmitter 12 to the receiver 14. Backplanes may vary in accordance with a number of parameters, such as layer stack-up, trace length, width and type such as stripline and microstrip. As such, a typical backplane 16 can be modeled in terms of a number of scattering parameters, such as the number of on the printed circuit board traces, the dimension of the traces and vias, and characteristics of the connectors 20 and the coax cables 22. It should be noted that the above listed scattering parameters is exemplary and should not be construed as limiting the invention. Rather, the term scattering parameter should be broadly construed as meaning any scattering parameter of a network or system.

In accordance with one embodiment of the invention, a mathematical model, which defines the behavior of the backplane 16 and link 24, is created. The mathematical model, hereafter sometimes referred to as a "simulated backplane," is created by providing input signal vectors at the output ports of transmitter 12 to the actual backplane 16 across link 24. The output signal vectors at the ports of the receiver 14 in response to the input signal vectors are then measured. The simulated backplane is thus defined by observing the measured output signals transmitted across the actual backplane 16 and entire link 24 in response to the input vectors. Accordingly, the mathematical model of the simulated backplane takes into account such scattering parameters such as but not limited to package traces, printed circuit board traces, vias, physical layer effects of the actual backplane 16, the connectors 20, and cables 22 of the entire link 24, including the target receiver 14, transmitter 12 and the backplane 16. The mathematical model defines four scattering or "S" parameters, designated as S11, S12, S21, and S22. The four S parameters are defined as:

$S_{11}$ measuring the ratio of the reflected wave of voltage coming out of a transmission port, Port 1, of the actual backplane versus the incident wave at the same Port 1 of the actual backplane;

$S_{12}$ measuring the ratio of the reflected wave of voltage coming out of Port 1 of the actual backplane versus the incident wave of voltage at another transmission port, Port 2, of the actual backplane;

$S_{21}$ measuring the ratio of the reflected wave of voltage coming out of Port 2 of the actual backplane versus the incident wave of voltage at Port 1 of the actual backplane; and $S_{22}$ measuring the ratio of the reflected wave of voltage coming out of Port 2 of the actual backplane versus the incident wave of voltage at Port 2, of the actual backplane.

Figure 2A:
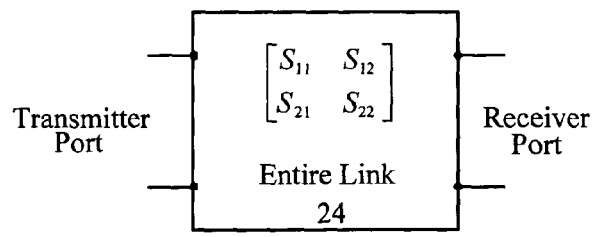
FIGS. 2A, 2B, and 2C are diagrams of a scattering parameter networks representing various backplane links according to different embodiments of the present invention.

Referring to FIG. 2A, a scattering parameter network 25 (i.e., a mathematical model) representing the backplane link 24 of FIG. 1 is shown. The simulated backplane is thus represented by the four scattering or S parameters S11, S12, S21, and S22.

Figure 2B:
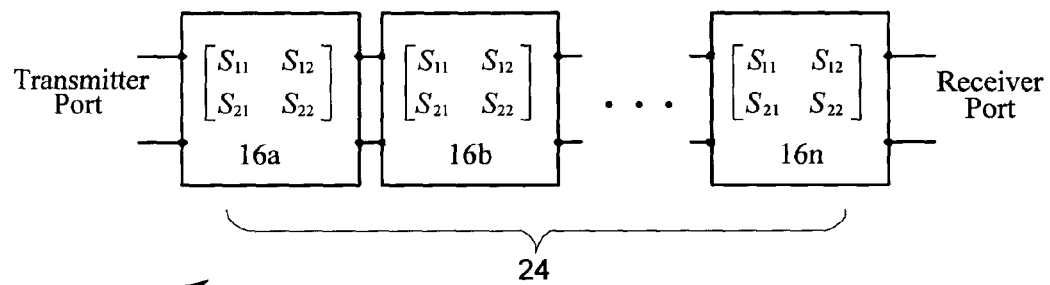

In other embodiments of the invention, the link 24 may include multiple backplanes 16, each serially connected to one another. Referring to FIG. 2B, a frequency dependent scattering parameter model 26 (i.e., a mathematical model) of a non-differential link 24 having multiple backplanes 16 is shown. The model 26 is created by observing the measured input and output signal vectors received at the input and output ports of each of the actual backplanes 16a through 16n respectively. The simulated backplane of the entire link 24 is thus obtained by linking the value of each S11, S12, S21 and S22 scattering parameters for each backplane 16a through 16n respectively.

Figure 2C:
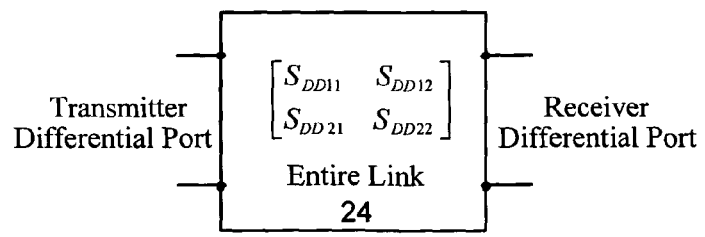

Referring to FIG. 2C, a model 27 of a differential link 24 is shown. In general, differential devices require four-port scattering parameter networks, which include differential, common, and mixed mode quantities. In the differential mode, the link 24 can be characterized with four differential scattering parameters as follows:

SDD11 measuring the ratio of the reflected wave of differential-mode voltage coming out of a differential-mode port, Port 1, of the actual backplane versus the incident wave of differential-mode voltage at the same differential-mode Port 1 of the actual backplane;

SDD12 measuring the ratio of the reflected wave of differential-mode voltage coming out of the differential-mode Port 1 of the actual backplane versus the incident wave of differential-mode voltage at another differential-mode port, Port 2, of the actual backplane;

SDD21 measuring the ratio of the reflected wave of differential-mode voltage coming out of the differential-mode Port 2 of the actual backplane versus the incident wave of differential-mode voltage at the differential-mode Port 2, of the actual backplane; and SDD22 measuring the ratio of the reflected wave of differential-mode voltage coming out of the differential-mode Port 2 of the actual backplane versus the incident wave of differential-mode voltage at the differential-mode Port 2, of the actual backplane.

The FIGS. 2A, 2B, and 2C illustrate three mathematical models representing simulated backplanes according to three embodiments of the present invention. It should be noted that these embodiments are merely exemplary. In no way should these specific simulated backplanes be construed as limiting the scope of the present invention. Rather, the above-described modeling method could be used to model or define a simulated backplane for any type or configuration of a data link 24 between a transmitter and a receiver.

Once the simulated backplane has been defined, the present invention involves the following: (i) capturing a data transmission from the transmitter 12 intended for the target receiver 14; (ii) performing a waveform simulation of the data transmission over the simulated backplane; and (iii) extrapolating a total jitter for a predetermined bit error rate for the data transmission over the actual backplane to the target receiver from the waveform simulation.

Figure 3:
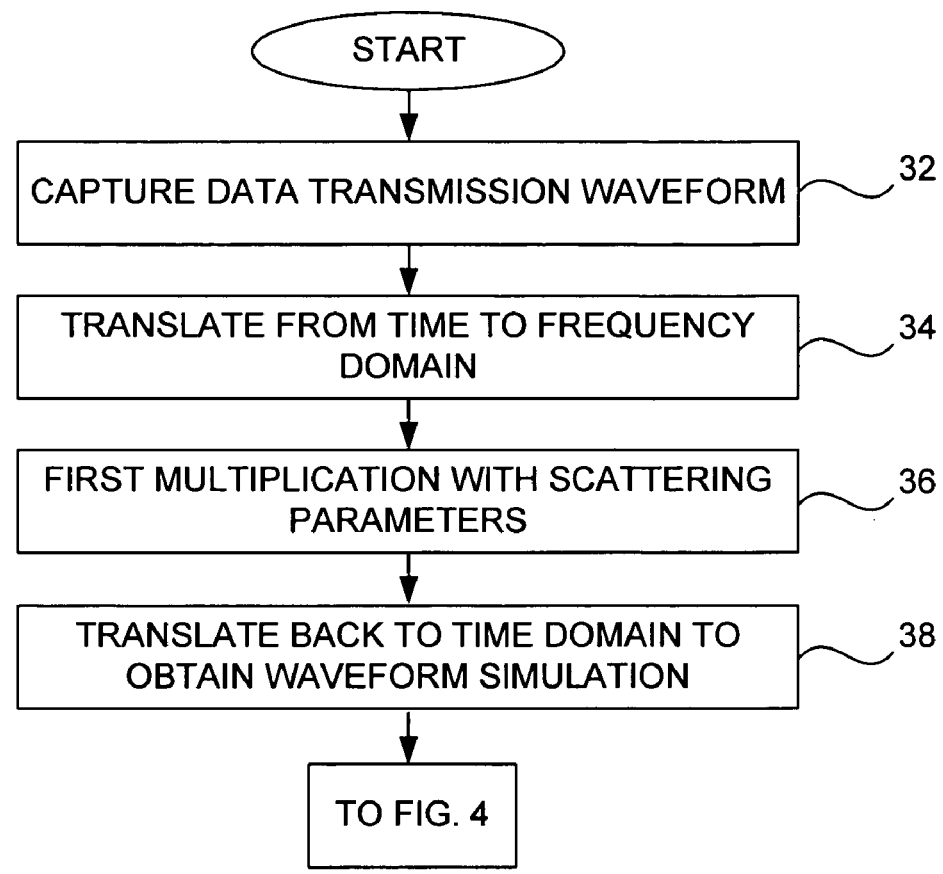
FIG. 3 is a flow diagram illustrating the sequence for obtaining a waveform simulation of a data transmission according to the present invention.
Figure 3:

Referring to FIG. 3, a flow diagram 30 illustrating the steps of the waveform simulation according to one embodiment of the present invention is shown. In the initial step, the data transmission waveform is captured (box 32). The captured data waveform is then translated from the time to frequency domain by a Fast Fourier Transform (box 34). The captured data waveform is then multiplied in the frequency domain with the scattering parameters of the link 24 as described above (box 36) and the scattering parameters of the receiver 14 (box 38), which is terminated at the end of the link 24. The multiplied data waveform is then converted back to the time domain by an inverse Fast Fourier Transform (box 38). The resulting waveform is a simulation (i.e., "waveform simulation") of the captured data transmitted across the simulated backplane, wherein the simulated backplane takes into account characteristics of both the backplane 16 and the target receiver 14.

Figure 4:
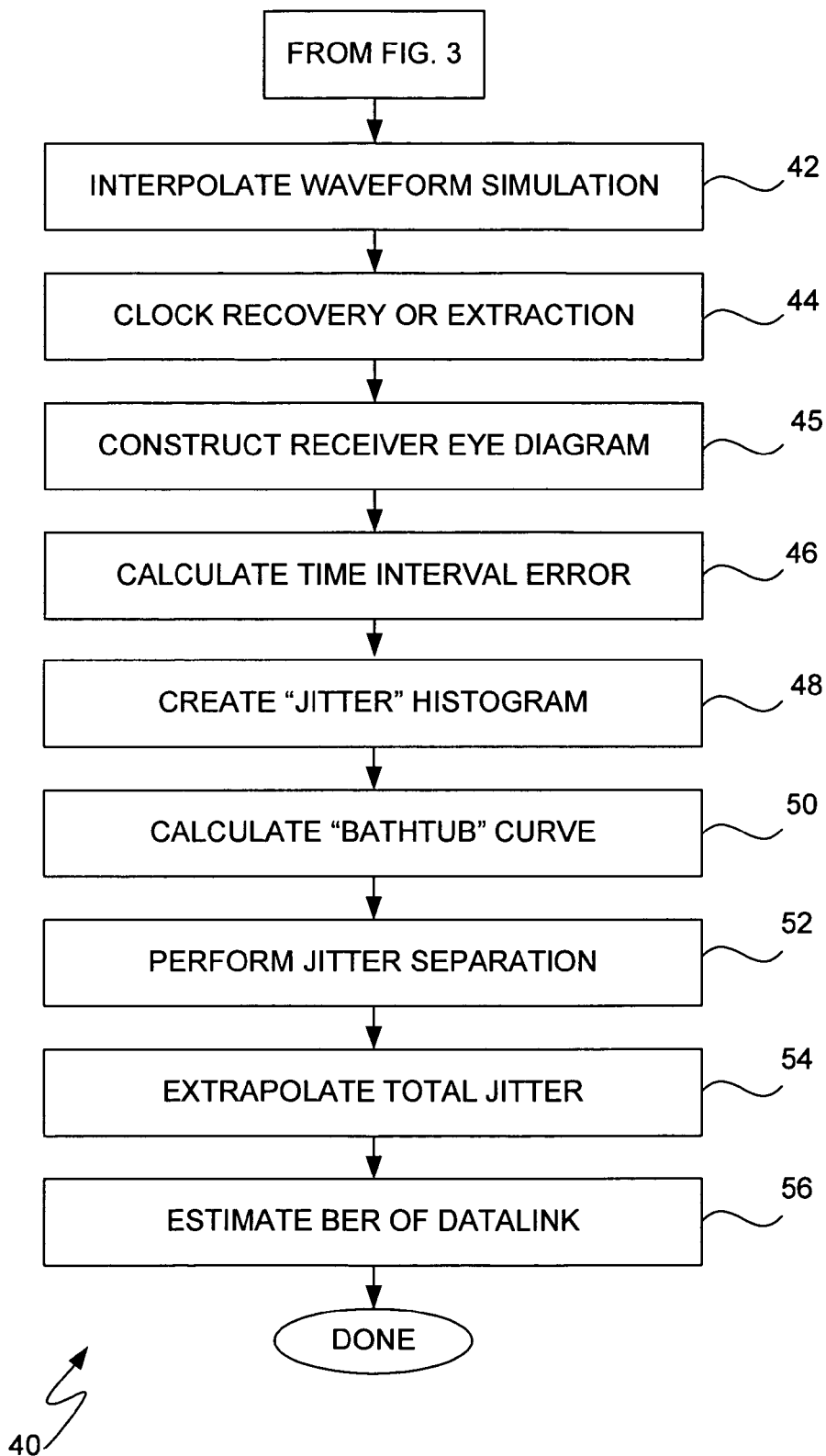
FIG. 4 is a flow diagram illustrating the sequence for estimating the bit error rate of a backplane link according to the present invention.

Referring to FIG. 4, a flow diagram 40 illustrating the steps for estimating the BER from the waveform simulation is shown. In the initial step, the waveform simulation is interpolated in the time domain (box 42). A clock signal is then recovered or extracted from the interpolated waveform simulation to estimate where the clock transitions ought to be (box 44) in the waveform simulation. The data transitions of the waveform simulation are then re-clocked. A receiver "eye" diagram is also constructed from the re-clocked data transitions by superimposing bits of the data waveform using the recovered clock transitions as a reference (box 45). Similarly, using the recovered clock as a reference, the Time Interval Error (TIE) is calculated for each bit in the interpolated waveform simulation (box 46). The TIE data is then sorted into bins to create a jitter histogram (box 48). The jitter histogram data is next integrated to create a "bathtub" curve (box 50). Jitter separation is thereafter performed by applying well-known algorithms to the TIE data, jitter histogram and bathtub curve (box 52). The total jitter is then extrapolated or estimated from the jitter separation value (box 54). Using measured values for setup and hold times, the maximum BER of the backplane link 24 is determined from a fully extrapolated bathtub curve (box 56).

The flow diagrams of FIGS. 3 and 4 provide a high-level description or overview of the method of the present invention. A more detailed explanation of each of the steps is provided below.

Figure 5:
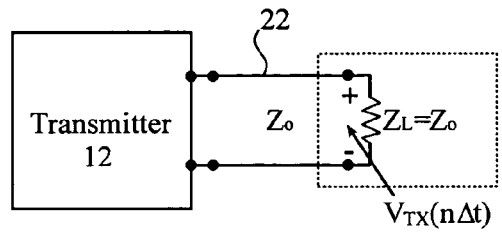
FIG. 5 is a diagram of schematic diagram illustrating the capture of a data transmission according to the present invention.

Referring to FIG. 5, a schematic diagram illustrating the capture of the data transmission from the transmitter 12. In accordance with one embodiment, an oscilloscope (not shown) is used to capture the voltage waveform of the data in real time. The waveform can be expressed with the equation $V_{TX}(n\Delta t)$ where $\Delta t$ is the time interval between two adjacent sampling points and $n=1 \ldots N$. Also $Z0$ is the characteristic impedance of the coax cable 22, which is typically 50 ohms. ZL is the load of the oscilloscope matched to equal $Z0$. In accordance with Nyquist's theorem, the sampling rate is at least two times the highest frequency of the data transmission.

As noted in box 34, the sampled data transmission waveform is converted to the frequency domain using a Fast Fourier Transform. An N-point Fast Fourier Transform is performed on $V_{TX}(n\Delta t)$ to obtain the frequency-domain response of $V_{TX}(k\Delta f)$ where:

$$V_{TX}(k\Delta f) = \int_{-\infty}^{+\infty} V_{TX}(n\Delta t) e^{-jkn(\Delta f)(\Delta t)} \quad (1)$$

where:
k=the index of the frequency component of the transmitted signal;

$$\Delta f = \frac{1}{\Delta t \cdot N};$$

j=sign of the conjugate or imaginary part; and
$\Delta t$=sampling time interval.

Figure 6:
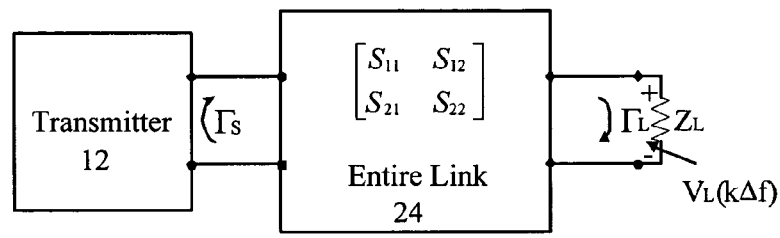
FIG. 6 is a schematic diagram illustrating a two-ported network representing a complete backplane link during data transmission in accordance with the present invention.

Referring to FIG. 6, a schematic diagram illustrating a two-ported network representing a complete backplane link 24 is shown. The scattering parameters, denoted by S11, S12, S21 and S22, represent the entire link 24, including the scattering parameters of both backplane 16 and the receiver 14 (i.e. the entire link 24). The two-ported network is used to represent the transmitter 12 coupled to an arbitrary load through the link 24. ZL designates the load represented by the receiver 14 or the sampling oscilloscope, Γs and ΓL are frequency dependent source and load reflection coefficients and are calculated using equation (2) below:

$$\Gamma_s(k\Delta f) = \frac{Z_s(k\Delta f) - Z_o}{Z_s(k\Delta f) + Z_o}; \ \Gamma_L(k\Delta f) = \frac{Z_L(k\Delta f) - Z_o}{Z_L(k\Delta f) + Z_o}. \quad (2)$$

Based on well known microwave network principles (i.e., the scattering matrix definition and signal flow graph theory), the total voltage drop at the load ZL can be expressed as:

$$V_L(k\Delta f) = \frac{(1 + \Gamma_L)S_{21}}{(1 - S_{11}\Gamma_s)(1 - S_{22}\Gamma_L) - S_{21}S_{12}\Gamma_L\Gamma_s} V_{TX}(k\Delta f), \quad (3)$$

where
$S_{11}(k\Delta f)$, $S_{21}(k\Delta f)$, $S_{12}(k\Delta f)$, $S_{22}(k\Delta f)$ are frequency-dependent, $k=0, \ldots, N-1$ Equations (2) and (3) are thus used to predict the voltage at the terminals of the receiver given the voltage waveform coming out of the transmitter, and the properties of the link 24, transmitter 12, and receiver 14. When the receiver is terminated at the end of the link 24, a complete S-parameter network is constructed, and this network includes the properties of both link 24 and the receiver 14.

When ZL represents the receiver 14, the equation (3) is used to obtain the voltage response at the receiver 14. In other words, equation (3) is used to generate the simulated waveform at the receiver in the frequency domain and which takes into account the scattering parameters of both the backplane 16 and the receiver 14 of the link 24.

As noted in box 38, the simulated waveform is then converted back to the time domain using the following equation:

$$V_L(k\Delta f) \xrightarrow{IFFT} V_L(m\Delta t), m = 0, \ldots, N-1 \quad (4)$$

In an alternative embodiment, equation (3) can be simplified to obtain a real time sampling at the oscilloscope (not shown). When ZL represents the load of the oscilloscope (i.e., ZL=Z0) then equation (3) simplifies to:

$$V_L(k\Delta f) = \frac{S_{21}}{(1 - S_{11}\Gamma_s)} V_{TX}(k\Delta f). \quad (5)$$

If $\Gamma$s or S11 is approximately close to zero, (5) is further reduced to $$V_L(k\Delta f) = S_{21}(k\Delta f) V_{TX}(k\Delta f) \quad (6)$$

An inverse fast Fourier transform (IFFT) is performed to obtain the time-domain response, which should be close to the waveform seen at the oscilloscope, as defined by equation (6).

$$V_L(k\Delta f) \xrightarrow{IFFT} V_L(m\Delta t), m = 0, \ldots, N-1 \quad (7)$$

The time domain data can then be used to generate an eye-diagram of the transmission data.

After reconstruction of the waveform simulation into the time domain, the signal is interpolated (box 42) to provide higher resolution. According to various embodiments, different interpolation schemes may be used, including but not limited to linear, cubic spline, or (sin x)/x (sometimes referred to as "sinc"). Linear is the simplest interpolation method, using only a first order polynomial to join the data points of the waveform with straight lines. A cubic spline interpolation is a piecewise construction of third order polynomials which each pass through a given set of points of the waveform. The sinc method is an ideal band-limited interpolation performed by a convolution with a (sin x)/x FIR filter.

A full rate clock signal is recovered or extracted from the interpolated waveform simulation as mentioned above with regard to box 44. The interpolated waveform resembles a series of bits, but without clock transitions distinguishing one bit from the next.

Figure 7:
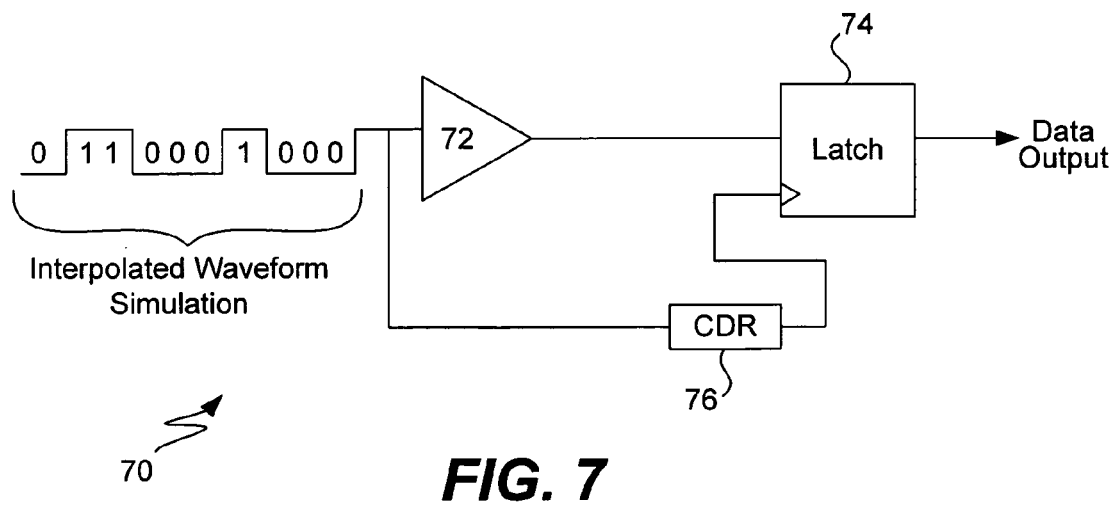
FIG. 7 illustrates a simulated clock recovery circuit according to the present invention.

Referring to FIG. 7, a clock recovery circuit is shown. The clock recovery circuit 70 includes a buffer 72 to receive or buffer a bit stream representative of the interpolated waveform simulation. The output of the buffer 72 is provided to the data input of a latch 74, such as a flip flop. A clock data recovery circuit (CDR) 76 is coupled between the bit stream and the clocked input of the latch 74. It should be noted of course that the clock recovery circuit 70, including the buffer 72, latch 74 and CDR 76, are all simulated in software.

During the software simulation, recovery circuit 70 operates as follows. The series of bits from the waveform simulation are provided to the buffer 70 and the CDR 76. The CDR 76 attempts to extract a clock signal out of the data stream by analyzing the data edge transitions and determining where the clock transitions ought to be. The simulated clock transitions are then provided to the clock input of the latch 74. The end result is the bits of the waveform simulation are re-timed with the recovered clock at the data output of the latch 74. The simulated clock signal from the CDR is used to drive the latch 74. With each clock cycle, the latch determines if the data at its input is either a logic one or logic zero. If the measured voltage is high (i.e., above a first threshold voltage) during the set up time of the latch 74, the latch 74 outputs a logic one signal. If the measured voltage is lower than a second threshold voltage during the set up time, the latch 74 outputs a logic zero. In this manner, the data bits of the waveform simulation are re-clocked. For the latch 74 to output data bits correctly, the data transition edges of the simulated waveform and the transitions of the recovered clock are required to satisfy the setup and hold time of the latch 74. If the data transition edges are excessively shifted in time relative to the recovered clock (i.e., there is a high degree of jitter) such that it violates the setup and hold time of the latch 74, the latch 74 will output erroneous data bits. Therefore, jitter in the data waveform relative to the recovered clock is used in cooperation with the setup and hold time of the latch to predict the probability of erroneous bits (a.k.a. bit error rate, bit error ratio, or BER) output from the latch 74.

On occasion the voltage of the data input during the set up time of a clock cycle is neither affirmatively high or low. In other words, the latch can not determine if a logic one or a logic zero should be outputted. There are typically two reasons for this problem. The data edges of the waveform simulation may not be where they should be (i.e., the data waveform is distorted). Alternatively, the CDR 74 may not be recovering the clock properly. In certain situations, the problem may be caused by a combination of both reasons.

In accordance with box 45 of FIG. 4, a receiver eye diagram is constructed from the re-clocked bit stream from latch 74. The eye diagram is constructed by taking each bit from the data stream and superimposing them one on top of the other, using the simulated clock signal from the CDR 76 as a reference. The resulting eye diagram provides a qualitative sense of how "clean" (i.e., non-distorted) is the recovered bit stream.

Figure 8A:
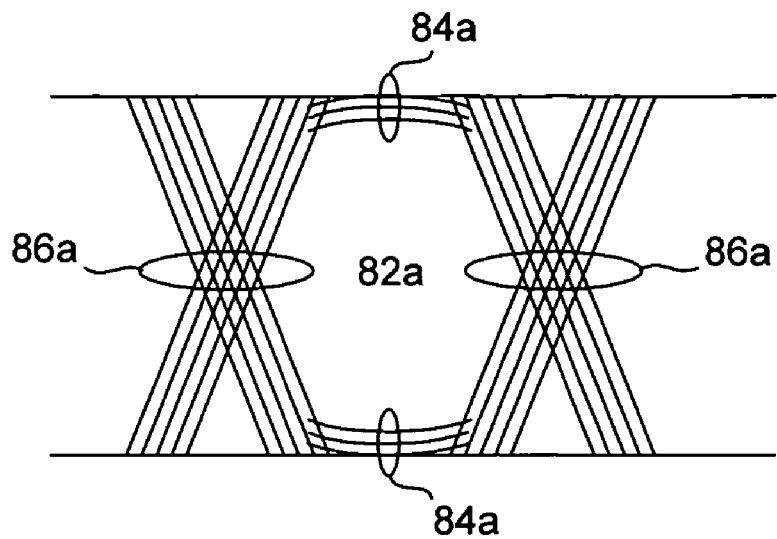
FIGS. 8A and 8B illustrate representative "clean" and "distorted" eye diagrams respectively.
Figure 8B:
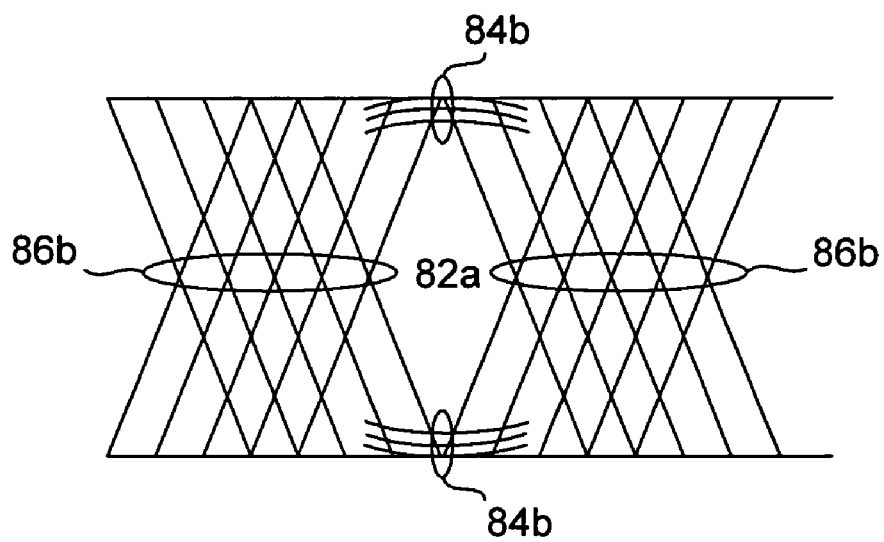

Referring to FIGS. 8A and 8B, two representative eye diagrams are shown. In the first diagram of FIG. 8A, the center region 82a, called the "eye" is wide, indicating that the bit stream is "clean" and non-distorted. On the other hand, the eye 82b of FIG. 8B is narrow, indicating the bit stream is distorted. Analyzing an eye diagram provides useful quantitative information. Measuring the thickness of the height of the eye diagram, as designated by reference number 84, provides a quantitative indication of the voltage noise on the bit stream. In FIG. 8A, the height of 84a is relatively shallow, indicating a non-distorted bit stream, whereas 84b is relatively high, indicating a high amount of noise and distortion. Similarly, the horizontal width 86a and 86b of the two eye diagrams provides a quantitative measure of the timing noise or jitter. In FIG. 8A, the width of 86a is relatively small, indicating a low amount of jitter. In FIG. 8B, the width of 86b is wide, indicating a large amount of timing jitter.

In the next step, the timing interval error (TIE) is calculated (box 46) for each bit in the data stream to quantify the amount of jitter. The timing interval error is the difference between a transition edge of the bit stream waveform at the threshold of the receiver 14 (typically fifty percent (50%) of the waveform amplitude) and the transition edge of the corresponding recovered clock. Additional interpolation of the waveform may be necessary or desirable to find or better define the transition edges. The timing interval error data for the entire waveform is a non-uniformly sampled set of data. It is also a sampling of the waveform's jitter behavior. If the waveform contains at least one repetition of the data (i.e., the data waveform comes from a test data pattern), the timing interval error data is a complete sampling of data-dependent jitter (DDJ). For periodic jitter (PJ), random jitter (RJ) and total jitter (TJ) at a bit error rate (BER) of 10-12, the time interval error data is only a statistical sampling.

The TIE data is sorted into bins to create a jitter histogram is created (box 48). The histogram is equivalent to the probably density function of TIE. The histogram is also equivalent to the probability density of the eye diagram at the receiver threshold.

The bathtub curve is next calculated (box 50) by performing two integrals of the TIE histogram. The integrals are defined by the equations (7) below:

$$BER_{left}(t) = \int_{t}^{\infty} PDF(t')dt' \quad (7)$$
$$BER_{right}(t) = \int_{-\infty}^{t} PDF(t')dt'$$

where $BER_{left}$ and $BER_{right}$ are the left and right bathtub curves, respectively. Because the bathtub curve is an integration of the PDF, it is sometimes referred to as a cumulative density function (CDF). The bathtub curve is also known as a bit error ratio tester (BERT) and is commonly referred to as the BERT scan. The bathtub curve shows the probability of finding a particular value of TJ (or eye opening).

Jitter separation (box 52) is performed by applying well-known algorithms to the data waveform, the histogram and/or the bathtub curve. These algorithms generally involve the least-squares fitting of various mathematical models to the PDF and/or CDF to extract relevant jitter components. Depending on the amount of available data, the components of jitter that can be measured include some or all of the following: RJ, DJ, PJ, DDJ, ISI, and DCD.

In the next step (box 54) total jitter (TJ) is extrapolated. Total jitter is a peak-to-peak value defined at a particular BER (typically $10^{-12}$). For example, a true measurement of TJ at BER=$10^{-12}$ would require a waveform with a minimum of one trillion bits of data, which is currently not feasible. Thus, there are many methodologies for extrapolating or estimating TJ at low BER from a smaller set of data. For example, such methodologies may include extrapolation of the bathtub curve to low BER, extrapolation of the jitter histogram to low probability density, and various approximations to long-term jitter behavior.

In the final step (box 56), the window for setup and hold times is found by measurement. This, in conjunction with a fully extrapolated bathtub curve to low BER will give an estimation of the maximum BER of the data link. The highest BER value found inside the setup and hold time is the maximum probability of erroneous bit in the data link.

Figure 9:
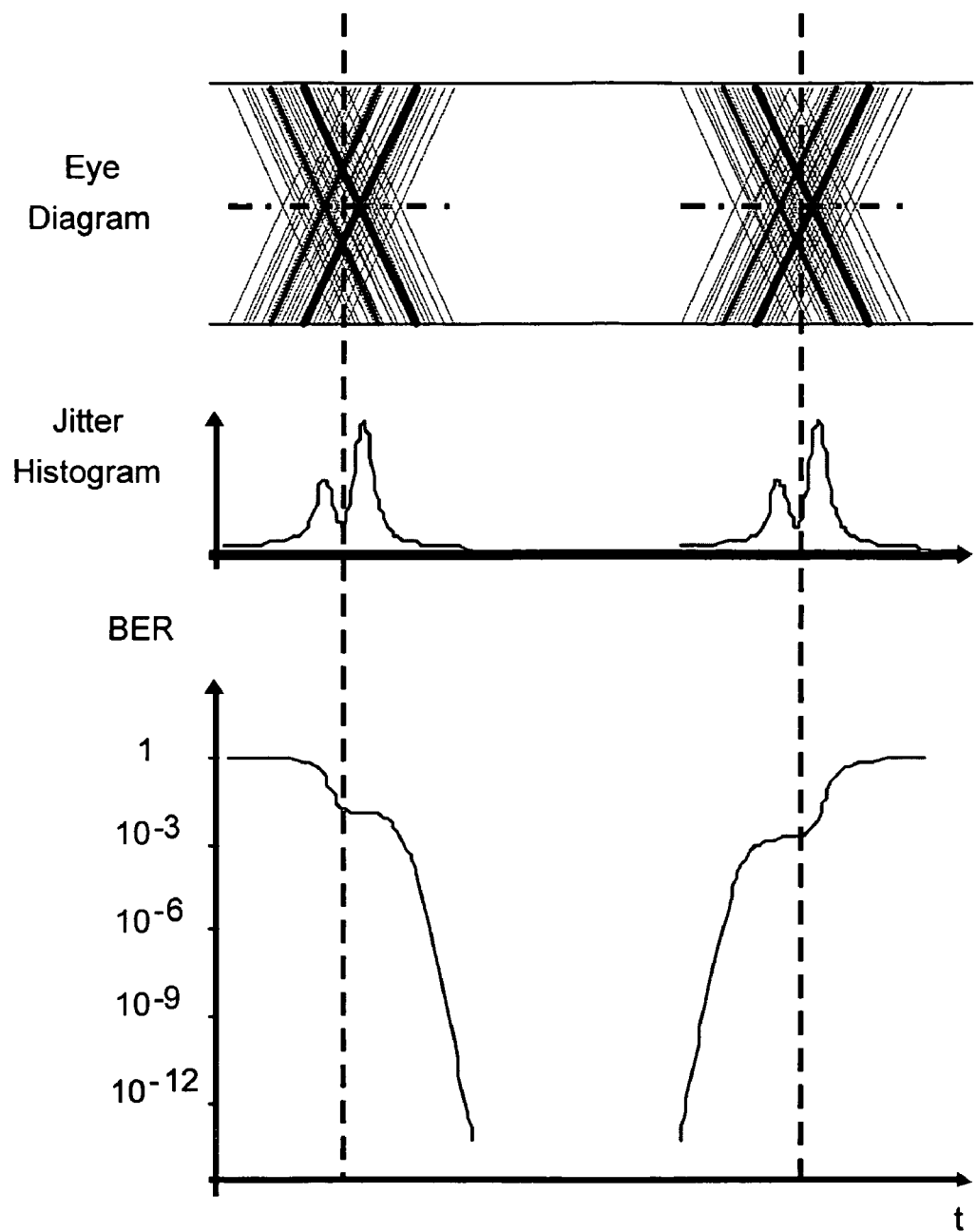
FIG. 9 illustrates the relationship between an eye diagram, jitter histogram and bit error ratio (BER) scan generated in accordance with the BER prediction method of the present invention.

Referring to FIG. 9, the relationship between an eye diagram, jitter histogram, and a bathtub curve is shown. The eye diagram is a qualitative description of the amount of jitter in the data waveform relative to the recovered clock. The TIE histogram is equivalent to the density of transitions in the eye diagram at the voltage threshold. The bathtub curve is equivalent to an indefinite integral of the jitter histogram.

Figure 10:
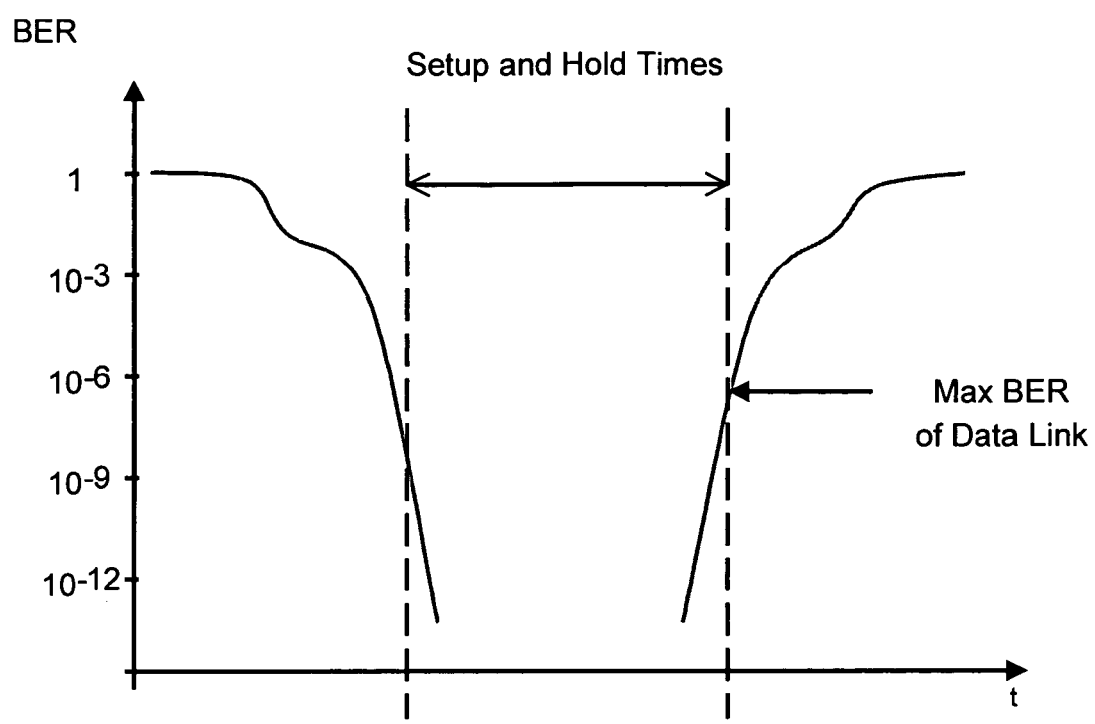
FIG. 10 is a BER scan of a backplane link with set up and hold times according to the present invention.

Referring to FIG. 10, a diagram illustrating the BER of a data link from an extrapolated bathtub curve with set up and hold times is shown. The highest BER value found inside the setup and hold time is the maximum BER of the data link.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention.

For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method, comprising:
defining a simulated backplane corresponding to an actual backplane, wherein the actual backplane is configurable for dual logic value transmission between a transmitter and a receiver, wherein the dual logic value transmission comprises a data transmission, wherein the data transmission comprises a first logic value and a second logic value, wherein the first logic value is a logical inverse of the second logic value;
capturing the dual logic value transmission from the transmitter for the receiver over the actual backplane;
performing a waveform simulation of the dual logic value transmission based on a plurality of characteristics of the simulated backplane and an impedance of the receiver; and
extrapolating a total jitter for a predetermined bit error rate for the dual logic value transmission from the waveform simulation.

2. The method of claim 1, wherein the capturing comprises sampling the dual logic value transmission from the transmitter at periodic intervals of at least two times a frequency of the dual logic value transmission.

3. The method of claim 1, wherein the capturing comprises measuring a voltage of the dual logic value transmission at periodic sample points.

4. The method of claim 1, wherein the capturing is in a time domain, and wherein said method further comprises generating the waveform simulation in a frequency domain by performing a Fast Fourier Transformation of the dual logic value transmission captured in the time domain.

5. The method of claim 4, further comprising:
multiplying, in the frequency domain, the waveform simulation with one or more scattering parameters;
reverse Fast Fourier Transforming the multiplied simulated waveform to convert the simulated waveform from the frequency domain to the time domain; and
obtaining a voltage signal in the time domain which is indicative of the dual logic value transmission as received by the receiver over the simulated backplane by performing the reverse Fast Fourier Transformation.

6. The method of claim 5, wherein the multiplying comprises multiplying, in the frequency domain, the simulated waveform and a plurality of scattering parameters of the actual backplane.

7. The method of claim 5, wherein multiplying further comprises multiplying the simulated waveform and a plurality of scattering parameters of the receiver in the frequency domain.

8. The method of claim 5, further comprising performing an interpolation of the voltage signal in the time domain.

9. The method of claim 8, wherein the performing the interpolation comprises performing one or more of the following types of interpolation: linear interpolation; first order polynomial interpolation; cubic spline interpolation using third-order polynomials, or sine interpolation.

10. The method of claim 8, wherein after performing the interpolation of the voltage signal, further:
ascertaining data edge transitions from the interpolated voltage signal;
simulating the recovery of a clock signal from the interpolated voltage signal by estimating where the clock transitions ought to occur from the ascertained data edge transitions; and re-timing the data edge transitions of the interpolated voltage signal using the recovered clock signal.

11. The method of claim 10, wherein the re-timing of the data edge transitions is performed by simulating performance of a latch, wherein the simulating the performance of the latch comprises:
generating first data bits of a first state when the data signals of the interpolated voltage signal as applied to a data input of the simulated latch are above a first voltage level during a predetermined setup time of the latch prior to a clock transition of the recovered clock signal; or
generating second data bits of a second state when the data signals of the interpolated voltage signal as applied to the data input of the simulated latch are below a second voltage level during the predetermined setup time of the latch prior to a clock transition of the recovered clock signal.

12. The method of claim 11, further comprising constructing an eye diagram by superimposing a predetermined number of the data edge transitions of the re-timed interpolated voltage signal.

13. The method of claim 11, further comprising determining a time interval error for each of the first data bits and the second data bits from the interpolated voltage signal.

14. The method of claim 13, generating a jitter histogram from the time interval error for each of the first data bits and the second data bits from the interpolated voltage signal.

15. The method of claim 14, further comprising generating a bit error ratio scan by performing integrals of the jitter histogram.

16. The method of claim 15, further comprising generating a jitter separation value from the bit error ratio scan.

17. The method of claim 15, further comprising extrapolating the total jitter for a predetermined bit error rate for the dual logic value transmission from the waveform simulation from the bit error ratio scan.

18. The method of claim 1, wherein defining the simulated backplane comprises:
providing input signal vectors to the actual backplane; and
measuring output signals generated by the actual backplane in response to the input signal vectors.

19. The method of claim 18, wherein defining the simulated backplane further comprises defining a backplane link between the transmitter and the receiver, the backplane link comprising package traces, printed circuit board (PCB) traces, vias, connectors, or other physical layer effects of the actual backplane and the receiver.

20. The method of claim 19, wherein the backplane link comprises a plurality of actual backplane links interconnected to one another.

21. The method of claim 19, wherein defining the simulated backplane comprises specifying differential interconnects between the transmitter, the actual backplane and the receiver.

22. The method of claim 21, wherein the specifying further comprises:
measuring a ratio of first reflected differential signals at a first port of the actual backplane versus first incident differential signals at the first port;
measuring a ratio of the first reflected differential signals versus second incident differential signals at a second port of the actual backplane;
measuring a ratio of second reflected differential signals at the second port versus the first incident differential signals; and
measuring a ratio of the second reflected differential signals versus the second incident differential signals.

23. The method of claim 18, wherein the measuring comprises:
measuring a ratio of first reflected signals at a first port of the actual backplane versus first incident signals at the first port;
measuring a ratio of the first reflected signals versus second incident signals at a second port of the actual backplane;
measuring a ratio of second reflected signals at the second port versus the first incident signals; and
measuring a ratio of the second reflected signals versus the second incident signals.

24. The method of claim 1, wherein the capturing comprises capturing the dual logic value transmission with an oscilloscope having an impedance that matches the impedance of the receiver.

25. A non-transitory computer readable medium containing computer instructions stored therein for causing a computer processor to perform the instructions, the instructions comprising:
instructions for defining a simulated backplane corresponding to an actual backplane, wherein the actual backplane is configurable for dual logic value transmission between a transmitter and a receiver, wherein the dual logic value transmission comprises a data transmission, wherein the data transmission comprises a first logic value and a second logic value, wherein the first logic value is a logical inverse of the second logic value;
instructions for capturing the dual logic value transmission from the transmitter intended for the receiver over the actual backplane;
instructions for performing a waveform simulation of the dual logic value transmission based on a plurality of characteristics of the simulated backplane and an impedance of the receiver; and
instructions for extrapolating a total jitter for a predetermined bit error rate for the dual logic value transmission from the waveform simulation.

26. The computer readable medium of claim 25, wherein the instructions for capturing the dual logic value transmission further comprise instructions for sampling the dual logic value transmission from the transmitter at periodic intervals of at least two times the frequency of the dual logic value transmission.

27. The computer readable medium of claim 25, wherein the instructions for capturing the dual logic value transmission further comprise instructions for measuring a voltage of the dual logic value transmission at periodic sample points.

28. The computer readable medium of claim 25, further comprising instructions for capturing the dual logic value transmission comprises instructions for capturing the dual logic value transmission from the transmitter intended to be sent to the receiver in a time domain, wherein the computer readable medium further comprises instructions for generating the waveform simulation in a frequency domain by performing a Fast Fourier Transformation of the dual logic value transmission captured in the time domain.

29. The computer readable medium of claim 28, wherein the instructions for defining the simulated backplane further comprise instructions for:
providing input signal vectors to the actual backplane; and
measuring output signals generated by the actual backplane in response to the input signal vectors.

30. The computer readable medium of claim 29, wherein the instructions for defining the simulated backplane further comprise instructions for defining a backplane link between the transmitter and the receiver, the backplane link comprising package traces, printed circuit board (PCB) traces, vias, or connectors and other physical layer effects of the actual backplane and the receiver.

31. The computer readable medium of claim 30, wherein the instructions for defining the simulated backplane comprise instructions for defining a backplane link between the transmitter and the receiver, wherein the backplane link comprises a plurality of actual backplane links interconnected to one another.

32. The computer readable medium of claim 30, wherein the instructions for defining the simulated backplane comprise instructions for specifying differential interconnects between the transmitter, the actual backplane and the receiver.

33. The computer readable medium of claim 32, wherein the instructions for specifying further comprise instructions for:
    measuring a ratio of first reflected differential signals at a first port of the actual backplane versus first incident differential signals at the first port;
    measuring a ratio of the first reflected differential signals versus second incident differential signals at a second port of the actual backplane;
    measuring a ratio of second reflected differential signals at the second port versus the first incident differential signals; and
    measuring a ratio of the second reflected differential signals versus the second incident differential signals.

34. The computer readable medium of claim 29, wherein the instructions for measuring further comprise instructions for:
    measuring a ratio of first reflected signals at a first port of the actual backplane versus first incident signals at the first port;
    measuring a ratio of the first reflected signals versus second incident signals at a second port of the actual backplane;
    measuring a ratio of second reflected signals at the second port versus the first incident signals; and
    measuring a ratio of the second reflected signals versus the second incident signals.

35. The computer readable medium of claim 30, further comprising instructions for:
    multiplying in the frequency domain the waveform simulation with one or more scattering parameters;
    reverse Fast Fourier Transforming the multiplied simulated waveform to convert the simulated waveform from the frequency domain to the time domain; and
    obtaining a voltage signal in the time domain which is indicative of the dual logic value transmission as received by the receiver over the simulated backplane by performing the reverse Fast Fourier Transformation.

36. The computer readable medium of claim 35, wherein the instructions for multiplying further comprise instructions for multiplying the simulated waveform and a plurality of scattering parameters of the actual backplane in the frequency domain.

37. The computer readable medium of claim 35, wherein the instructions for multiplying further comprise instructions for multiplying the simulated waveform and a plurality of scattering parameters of the receiver in the frequency domain.

38. The computer readable medium of claim 35, further comprising instructions for performing an interpolation of the voltage signal in the time domain.

39. The computer readable medium of claim 38, wherein the instructions for performing the interpolation further comprise instructions for performing one or more of the following types of interpolation: linear interpolation; first order polynomial interpolation; cubic spline interpolation using third-order polynomials, or sine interpolation.

40. The computer readable medium of claim 38, wherein after performing the interpolation of the voltage signal, further instructions are provided for:
    ascertaining data edge transitions from the interpolated voltage signal;
    simulating the recovery of a clock signal from the interpolated voltage signal by estimating where the clock transitions ought to occur from the ascertained data edge transitions; and
    re-timing the data edge transitions of the interpolated voltage signal using the recovered clock signal.

41. The computer readable medium of claim 40, wherein the instructions for re-timing of the data edge transitions is performed by instructions for simulating performance of a latch, wherein the simulated latch is configurable to:
    generate first data bits of a first state when the data signals of the interpolated voltage signal as applied to a data input of the simulated latch are above a first voltage level during a predetermined setup time of the latch prior to a clock transition of the recovered clock signal; or
    generate second data bits of a second state when the data signals of the interpolated voltage signal as applied to the data input of the simulated latch are below a second voltage level during the predetermined setup time of the latch prior to a clock transition of the recovered clock signal.

42. The computer readable medium of claim 41, further comprising instructions for constructing an eye diagram by superimposing a predetermined number of the data edge transitions of the re-timed interpolated voltage signal.

43. The computer readable medium of claim 41, further comprising instructions for determining the time interval error for each of the first data bits and the second data bits from the interpolated voltage signal.

44. The computer readable medium of claim 43, further comprising instructions for generating a jitter histogram from the time interval error for each of the first data bits and the second data bits from the interpolated voltage signal.

45. The computer readable medium of claim 44, further comprising instructions for generating a bit error ratio scan by performing integrals of the jitter histogram.

46. The computer readable medium of claim 45, further comprising instructions for generating a jitter separation value from the bit error ratio scan.

47. The computer readable medium of claim 45, further comprising instructions for extrapolating the total jitter for a predetermined bit error rate for the dual logic value transmission from the waveform simulation from the bit error ratio scan.

* * * * *